(12) United States Patent
Tanno

(10) Patent No.: US 7,847,908 B2
(45) Date of Patent: Dec. 7, 2010

(54) LIQUID CRYSTAL DISPLAY DEVICE

(75) Inventor: Junji Tanno, Chiba (JP)

(73) Assignee: Hitachi Displays Ltd., Chiba-ken (JP)

( * ) Notice: Subject to any disclaimer, the term of this patent is extended or adjusted under 35 U.S.C. 154(b) by 825 days.

(21) Appl. No.: 11/797,479

(22) Filed: May 3, 2007

(65) Prior Publication Data

US 2007/0268443 A1 Nov. 22, 2007

(30) Foreign Application Priority Data

May 16, 2006 (JP) .............................. 2006-136070

(51) Int. Cl.
*G02F 1/1343* (2006.01)
*G02F 1/1345* (2006.01)
(52) U.S. Cl. ...................... 349/147; 349/149
(58) Field of Classification Search ............... 349/147
See application file for complete search history.

(56) References Cited

U.S. PATENT DOCUMENTS 6,972,434 B2 * 12/2005 Misaki et al. ............... 257/72

2006/0139549 A1 * 6/2006 Ahn et al. ................. 349/141
2007/0024790 A1 * 2/2007 Chang et al. .............. 349/139

\* cited by examiner

*Primary Examiner*—Michelle R Connelly Cushwa
(74) *Attorney, Agent, or Firm*—Stites & Harbison PLLC; Juan Carlos A. Marquez, Esq.

(57) ABSTRACT

The present invention provides a liquid crystal display device comprising a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, and the upper electrode portion is constituted of a first transparent conductive film and a second transparent conductive film which is formed on the first transparent conductive film.

17 Claims, 5 Drawing Sheets

LIQUID CRYSTAL DISPLAY DEVICE

The present application claims priority from Japanese applications JP2006-136070 filed on May 16, 2006, the content of which is hereby incorporated by reference into this application.

BACKGROUND OF THE INVENTION

1. Field of the Invention

The present invention relates to a liquid crystal display device, and more particularly to a liquid crystal display device which can prevent corrosion of a terminal portion thus enhancing reliability of the liquid crystal display device.

2. Description of Related Art

For example, as described in following patent document 1 or the like, a transflective liquid crystal display device which includes a transmissive portion and a reflective portion within one sub pixel has been used as a display of portable equipment.

In such a transflective liquid crystal display device, a semiconductor chip which constitutes a drive circuit is mounted on one glass substrate which constitutes a liquid crystal display panel in a COG method. That is, bump electrodes of the semiconductor chip are electrically and mechanically connected to a terminal portion (pad electrode) formed on the glass substrate.

FIG. 8 is a cross-sectional view for explaining the constitution of a terminal portion of a conventional transflective liquid crystal display device. As shown in FIG. 8, the conventional terminal portion includes a lower electrode portion (TL) which is formed on a glass substrate (SUB1), and an upper electrode portion (TH) which is formed on the lower electrode portion (TL) and is electrically connected with the lower electrode portion (TL).

Further, the lower electrode portion (TL) is covered with an insulation film (PAST) having an opening portion (CHT) through which a portion of the lower electrode portion (TL) is exposed, and the upper electrode portion (TH) is formed on the insulation film (PAST) and is electrically connected with the lower electrode portion (TL) at an opening portion which is formed in the insulation film (PAST).

Here, the lower electrode portion (TL) is, for example, formed of a metal film made of aluminum (Al) or the like, or an alloy film made of AlNd (neodymium) or the like, while the upper electrode portion (TH) is formed of an amorphous ITO film.

SUMMARY OF THE INVENTION

In manufacturing steps of the transflective liquid crystal display device, in a state that the amorphous ITO film which constitutes the upper electrode portion (TH) is formed, a reflective electrode which is formed above the amorphous ITO film is etched. In this case, an etchant blocking effect of the amorphous ITO film is small and hence, an Al etchant which etches the reflective electrode passes through the amorphous ITO film and dissolves the Al film or the Al alloy film which constitutes the lower electrode portion (TL).

A path through which the etchant impregnates is formed and hence, to add treatment using an alkali cleaning liquid in a succeeding manufacturing step, the terminal portion is corroded thus deteriorating the reliability of the liquid crystal display device.

To overcome this drawback, following three methods are considered.

(1) A film thickness of the amorphous ITO film which constitutes the upper electrode portion (TH) is increased.

(2) Amorphous ITO is crystallized before etching the reflective electrode.

(3) Two metals which form the reflective electrode and the lower electrode portion (TL) are made different from each other in kind.

However, the above-mentioned method (1) has a drawback that when the film thickness of the amorphous ITO film is increased to an extent the amorphous ITO film can sufficiently cope with the above-mentioned drawback, the transmissivity of the amorphous ITO film is lowered thus lowering a throughput of the liquid crystal display device. Further, the above-mentioned method (2) has a drawback that when the amorphous ITO is crystallized, strong acid such as HBr or aqua regal is is applied to the reflective film and hence, metal of the reflective film which can resist such strong acid must be selected whereby a metal selection range is narrowed and making the acquisition of a sufficient reflectance difficult. Further, the above-mentioned method (3) has a drawback that steps for manufacturing the transflective liquid crystal display device become complicated in a case of making two metals for forming the reflective electrode and the lower electrode portion (TL) different from each other in kind and a selection range of metal materials is narrowed.

When metal materials are stacked, it may be possible to expect a protection effect attributed to a capped metal. However, this structure also has a drawback that an etching step is increased.

The present invention has been made to overcome the above-mentioned drawbacks of the related art and it is an object of the present invention to provide a technique which can prevent corrosion of a terminal portion during manufacturing steps of a liquid crystal display device thus enhancing the reliability of the liquid crystal display device.

The above-mentioned and other objects and novel features of the present invention will become apparent from the description of this specification and attached drawings.

To briefly explain the summary of typical inventions among the inventions disclosed in this specification, they are as follows.

(1) A liquid crystal display device is provided with a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, and the upper electrode portion is constituted of a first transparent conductive film and a second transparent conductive film which is formed on the first transparent conductive film.

(2) A liquid crystal display device is provided with a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, and the upper electrode portion is constituted of a first transparent conductive film, a first metal film which is formed on the first transparent conductive film, and a second transparent conductive film which is formed on the first metal film.

(3) In the above-mentioned constitution 2, the first metal film is an Al film or an Al alloy film.

(4) A liquid crystal display device is provided with a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, the upper electrode portion is constituted of a transparent conductive film, and assuming a thickness of the transparent conductive film of the upper electrode portion as do and a thickness of the electrode having a larger thickness out of the pixel electrode or the counter electrode as dc, a relationship of $1.2 < do/dc < 2$ is satisfied.

(5) In any one of the above-mentioned constitutions (1) to (4), the transparent conductive film of the upper electrode is formed of an amorphous ITO film.

(6) In any one of the above-mentioned constitutions (1) to (5), the liquid crystal display device includes an insulation film which covers the upper electrode portion and has an opening portion through which a portion of the upper electrode portion is exposed, and the lower electrode portion is electrically connected with the upper electrode portion which is formed on the insulation film through the opening portion formed in the insulation film.

(7) In any one of the above-mentioned constitutions (1) to (6), the lower electrode portion is constituted of a second metal film.

(8) In the above-mentioned constitution (7), the second metal film is an Al film or an Al alloy film.

(9) In any one of the above-mentioned constitutions (1) to (8), the pixel electrodes and the counter electrodes are formed on one substrate out of the pair of substrates.

(10) In the above-mentioned constitution (9), the liquid crystal display device includes an interlayer insulation film formed on the counter electrodes, and the pixel electrodes are formed on the interlayer insulation film.

(11) In any one of the above-mentioned constitutions (1) to (10), the liquid crystal display device is a transflective liquid crystal display device in which each sub pixel has a transmissive portion and a reflective portion.

To briefly explain the advantageous effects obtained by the typical inventions among the inventions described in this specification, they are as follows.

According to the liquid crystal display device of the present invention, the corrosion of the terminal portion during the manufacturing steps can be prevented thus enhancing the reliability of the liquid crystal display device.

DESCRIPTION OF THE PREFERRED EMBODIMENTS

Hereinafter, an embodiment of the present invention is explained in detail in conjunction with the drawings.

Here, in all the drawings for explaining the embodiments, parts having identical functions are given same symbols and their repeated explanation is omitted.

Figure 1:
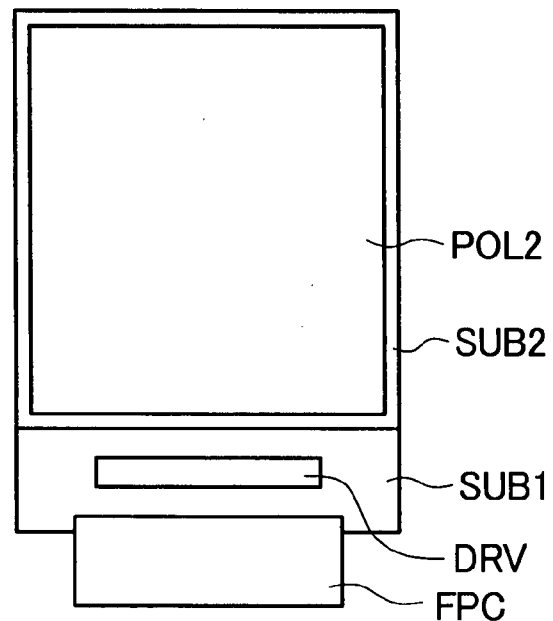
FIG. 1 is a plan view of a transflective liquid crystal display device of an embodiment of the present invention.

FIG. 1 is a plan view of a transflective liquid crystal display device of the embodiment according to the present invention. In FIG. 1, symbols SUB1 and SUB2 indicate glass substrates, symbol DRV indicates a semiconductor chip, symbol POL2 indicates an upper polarizer, and symbol FPC indicates a flexible printed circuit board.

The transflective liquid crystal display device of the embodiment is configured such that a glass substrate (also referred to as a TFT substrate) (SUB1) on which pixel electrodes, thin film transistors (TFT) and the like are formed and a glass substrate (also referred to as a CF substrate) (not shown in the drawing) on which color filters and the like are formed are overlapped with each other with a predetermined gap therebetween, both substrates are adhered to each other using a sealing material provided in a frame-like manner in the vicinity of a peripheral portion between the both substrates and, at the same time, liquid crystal is filled in a space defined inside the sealing material between both substrates through a liquid crystal sealing port formed in a portion of the sealing material and sealed in the space and, further, a polarizer is adhered to outer sides of both substrates.

In the liquid crystal display device shown in FIG. 1, a semiconductor chip (DRV) which constitutes a drive circuit is mounted on the glass substrate (SUB1).

Here, in FIG. 1, although a case in which the drive circuit is constituted of one semiconductor chip (DRV) is illustrated, the drive circuit may be directly formed on the glass substrate (SUB1) using a thin film transistor which uses low-temperature polysilicon as a material of a semiconductor layer thereof, for example.

In the same manner, the drive circuit may be configured such that a partial circuit of the drive circuit is divided and the drive circuit is constituted of a plurality of the semiconductor chips or a partial circuit of the drive circuit may be directly formed on the glass substrate (SUB1) using a thin film transistor which uses low-temperature polysilicon as a material of a semiconductor layer thereof, for example.

Further, the drive circuit (DRV) or the partial circuit of the drive circuit (DRV) may be formed on the flexible printed circuit board (FPC) instead of the glass substrate (SUB1).

Figure 2:
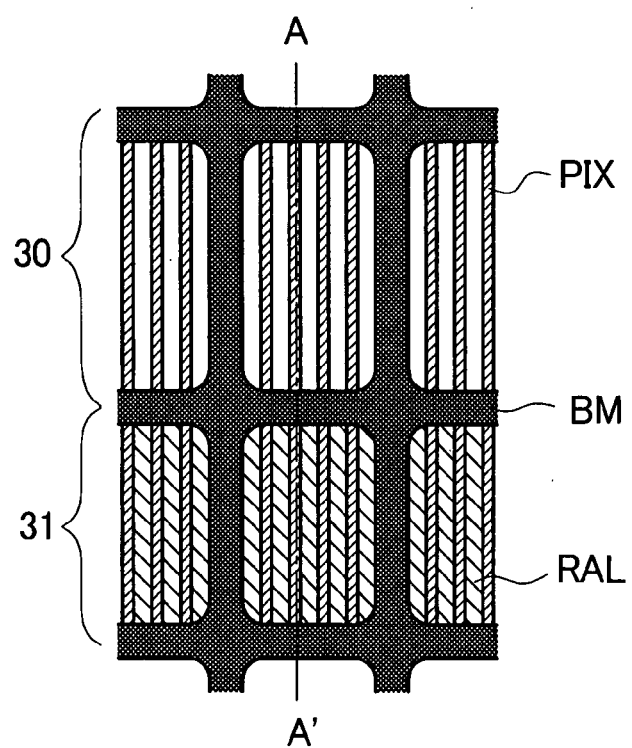
FIG. 2 is a plan view of one sub pixel on a TFT substrate side of the transflective liquid crystal display device of the embodiment of the present invention.
Figure 3:
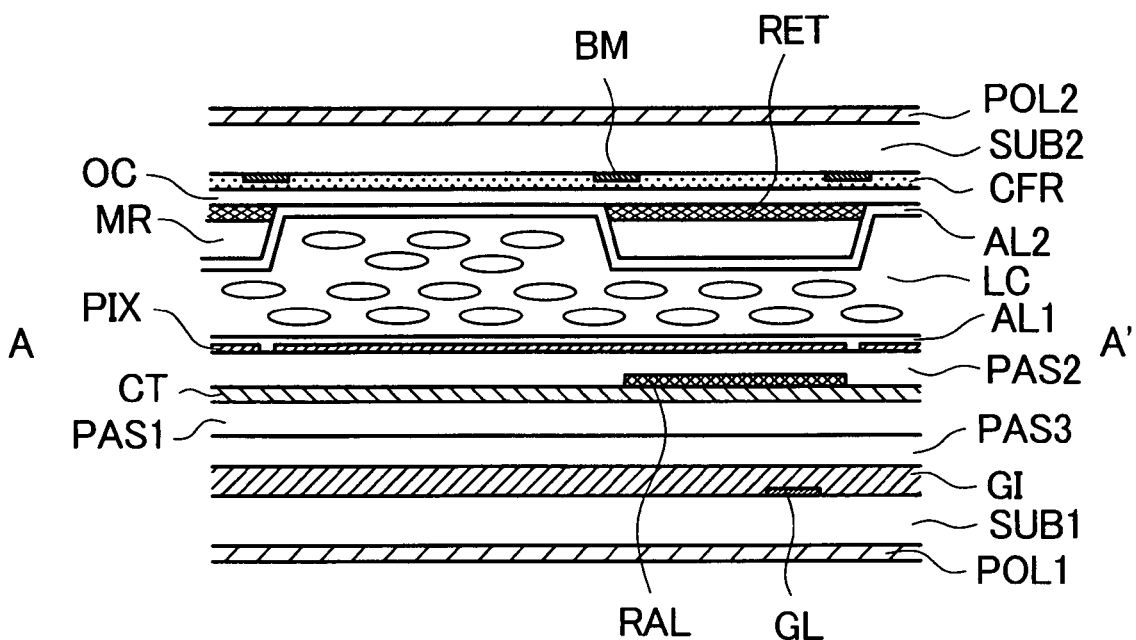
FIG. 3 is a cross-sectional view showing the cross-sectional structure taken along a line A-A' in FIG. 2.

FIG. 2 is a plan view of one sub pixel formed on a TFT substrate side of the transflective liquid crystal display device of the embodiment of the present invention. FIG. 3 is a cross-sectional view showing the cross-sectional structure shown in FIG. 2 taken along a line A-A'. In FIG. 2, numeral 30 indicates a transmissive portion, numeral 31 indicates a reflective portion, and symbol BM indicates a black matrix.

In the transflective liquid crystal display device of the embodiment, a main surface side of the glass substrate (SUB2) constitutes a viewer side.

On a liquid crystal layer side of the glass substrate (SUB2), in order from the glass substrate (SUB2) toward a liquid crystal layer (LC), the black matrix (BM), a red color filter layer (CFR), a green color filter layer and a blue color filter layer (In FIG. 2, only CFR being shown), a protection film (OC), a retardation plate (½ wavelength plate) (RET) which changes a polarized state of light, a stepped-portion-forming layer (MR), and an orientation film (AL2) are formed sequentially. Here, on an outer side of the glass substrate (SUB2), an upper polarizer (POL2) is formed.

Further, on the liquid crystal layer side of the glass substrate (SUB1; also referred to as a TFT substrate), in order from the glass substrate (SUB1) toward the liquid crystal layer (LC), a gate insulation film (GI), a scanning line (GL), an interlayer insulation film (PAS3), a video line (not shown in the drawing), an interlayer insulation film (PAS1), a counter electrode (CT), a reflective electrode (RAL), an interlayer insulation film (PAS2), a pixel electrode (PIX), and an orientation film (AL1) are formed sequentially. Here, on an outer side of the glass substrate (SUB1), a lower polarizer (POLL) is formed.

Here, the counter electrode (CT) is formed in a planar form and, further, the pixel electrode (PIX) and the counter electrode (CT) are overlapped with each other by way of the interlayer insulation film (PAS2) therebetween thus forming holding capacitance. The pixel electrode (PIX) and the counter electrode (CT) are, for example, constituted of a transparent conductive film made of ITO (Indium Tin Oxide) or the like. Here, the interlayer insulation film (PAS2) is not limited to the single-layered structure and the interlayer may be formed of the two-or-more layered structure.

The reflective portion 31 includes a reflective electrode (RAL). The reflective electrode (RAL) may be formed of, for example, a metal film made of aluminum (Al) or the two-layered structure having a lower layer of molybdenum (Mo) and an upper layer of aluminum (Al).

Also in the transflective liquid crystal display device of the embodiment, the pixel electrode (PIX) and the counter electrode (CT) in a planar shape are stacked by way of the interlayer insulation film (PAS2), wherein arcuate lines of electric force which are generated between the pixel electrode (PIX) and the counter electrode (CT) are distributed such that the lines of electric force penetrate the liquid crystal layer (LC) thus changing the orientation of the liquid crystal layer (LC).

A cell-gap length in the reflective portion 31 is set to approximately one half of the cell-gap length in the transmissive portion 30. Since light passes through the reflective portion 31 twice in an outgoing path and in an incoming path, such setting is performed to make the optical path length of the transmissive portion 30 approximately equal to the optical path length of the reflective portion 31.

While contrast of light is displayed by making use of the birefringence of the liquid crystal layer (LC) in the transmissive portion 30, in the reflective portion 31, the contrast of light is displayed by making use of birefringence of a retardation plate (½ wavelength plate) (RET) and the liquid crystal layer (LC) arranged in the inside of the liquid crystal display panel.

In the transflective liquid crystal display device of this embodiment, on the glass substrate (SUB1), a semiconductor chip (DRV) which constitutes a drive circuit is mounted using a COG method. That is, bump electrodes of the semiconductor chip (DRV) are electrically and mechanically connected with a terminal portion (pad electrodes) formed on the glass substrate (SUB1).

Figure 4:
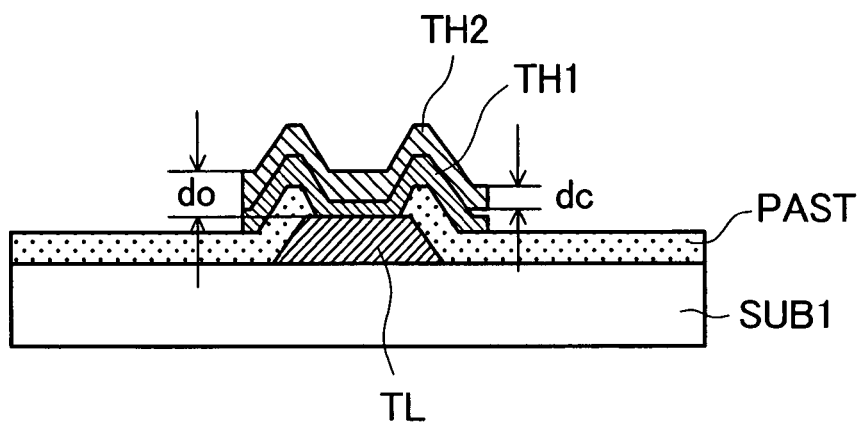
FIG. 4 is a cross-sectional view for explaining the constitution of a terminal portion of the transflective liquid crystal display device of the embodiment of the present invention.
Figure 5A:
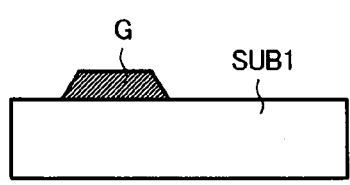
FIG. 5A to FIG. 5I are views for explaining a manufacturing method of the TFT substrate side of the transflective liquid crystal display device of the embodiment of the present invention.
Figure 5A:
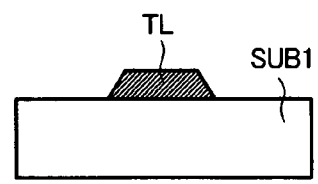
Figure 5B:
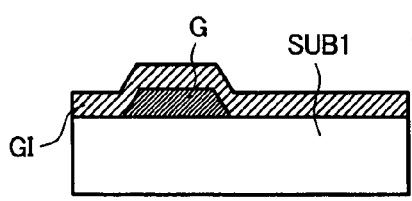
Figure 5B:
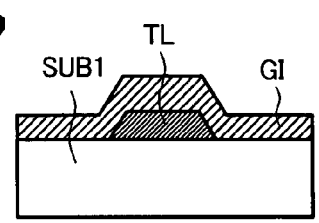
Figure 5C:
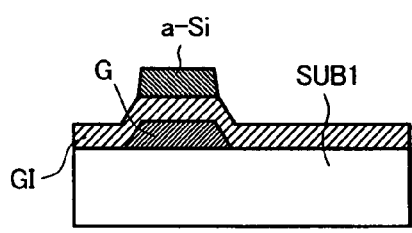
Figure 5C:
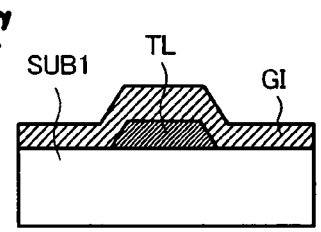
Figure 5D:
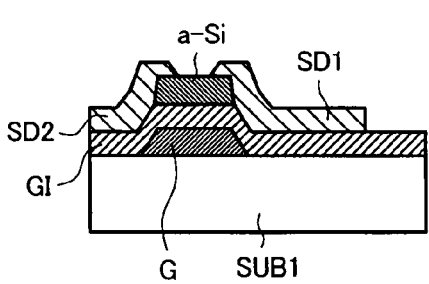
Figure 5D:
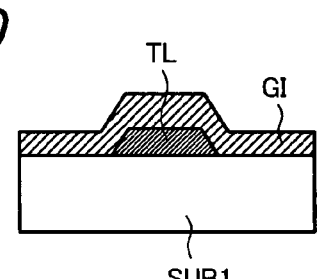
Figure 5E:
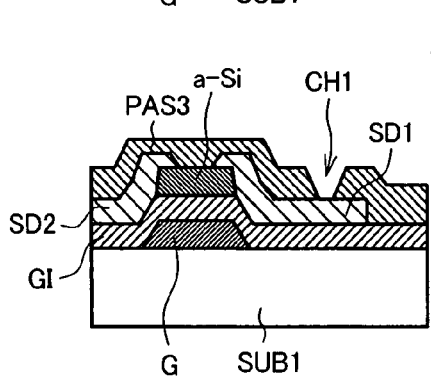
Figure 5E:
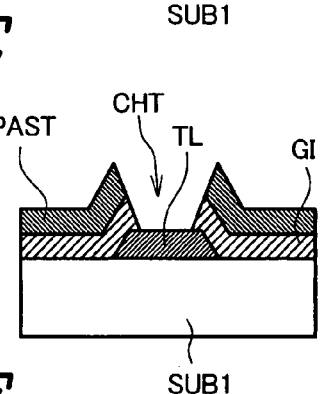
Figure 5F:
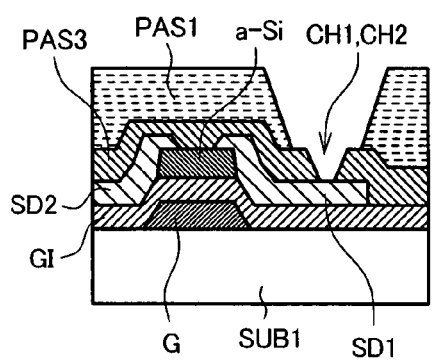
Figure 5F:
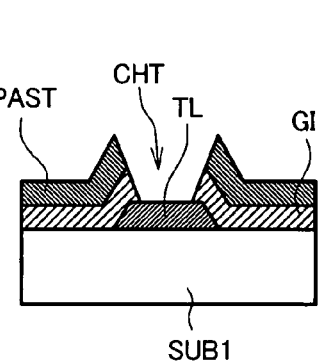
Figure 5G:
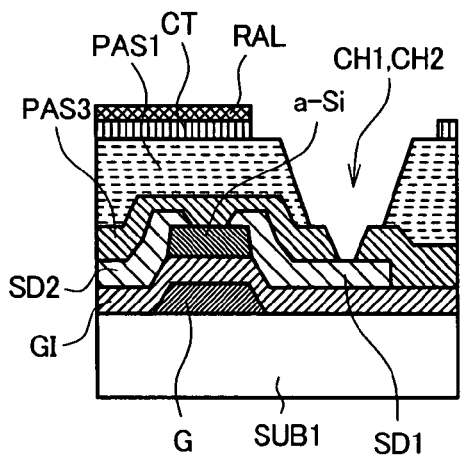
Figure 5G:
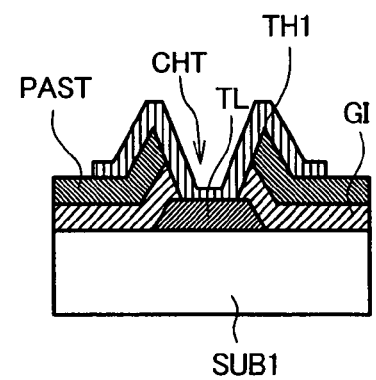
Figure 5H:
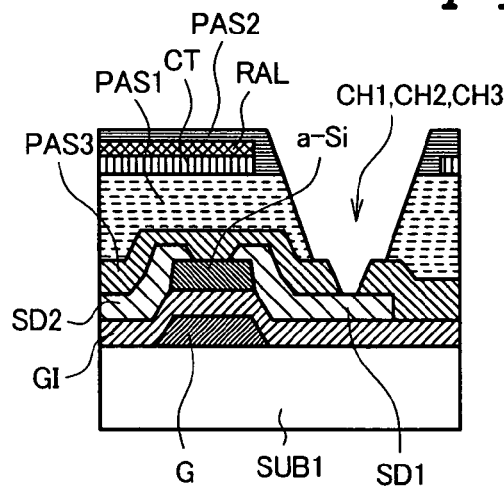
Figure 5H:
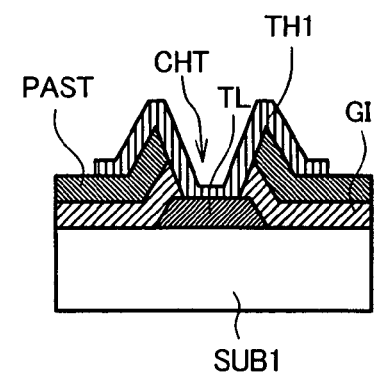
Figure 5I:
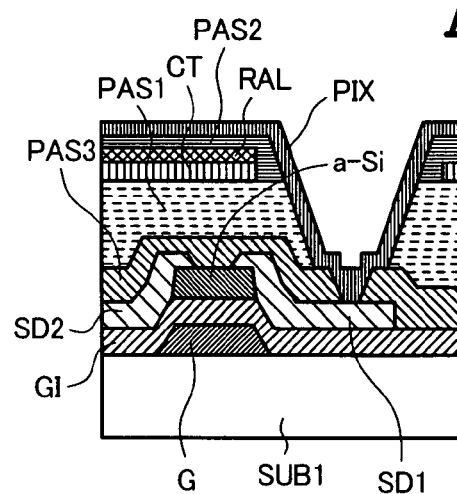
Figure 5I:
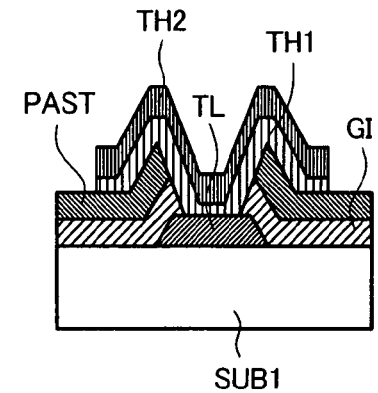

FIG. 4 is a cross-sectional view for explaining the constitution of the terminal portion of the transflective liquid crystal display device of this embodiment. As shown in FIG. 4, the terminal portion of this embodiment differs from the conventional terminal portion structure with respect to the point that an upper electrode portion (TH) is constituted of a first transparent conductive film (TH1), and a second transparent conductive film (TH2) which is formed on the first transparent conductive film (TH1).

Here, the first transparent conductive film (TH1) and the second transparent conductive film (TH2) are constituted of an amorphous ITO film, wherein the first transparent conductive film (TH1) is formed in the same step as the counter electrode (CT), and the second transparent conductive film (TH2) is formed in the same step as the pixel electrode (PIX).

Accordingly, in this embodiment, assuming a thickness (do in FIG. 4) of a portion where the first transparent conductive film (TH1) and the second transparent conductive film (TH2) are overlapped to each other and a thickness of the electrode having a larger thickness out of the counter electrode (CT) and the pixel electrode (PIX) (estimating a case of the second transparent conductive film (TH2) in FIG. 4) as dc, a relationship of $1.2 < do/dc < 2$ is satisfied.

Also in this embodiment, a path through which an etchant impregnates is formed in the first transparent conductive film (TH1). However, due to the provision of the second transparent conductive film (TH2), the path formed in the first transparent conductive film (TH1) through which the etchant impregnates can be interrupted and hence, even when the treatment using an alkali cleaning liquid in a succeeding manufacturing step is added, the corrosion of the terminal portion can be prevented thus enhancing the reliability of the liquid crystal display device.

Here, when the lower electrode portion (TL) of the terminal portion shown in FIG. 4 and the video line formed on the insulation film (PAST) are connected with each other, the lower electrode portion (TL) and the video line are connected with each other in a region other than the display region (or an effective pixel region).

Next, a manufacturing method of the TFT substrate side of the transflective liquid crystal display device of this embodiment is explained in conjunction with FIG. 5A to FIG. 5I.

Here, in these drawings, characters at the center are the abbreviation of names of steps, the left side indicates the flow of forming of the pixel portion as viewed in a cross-sectional shape, and the right side shows the flow of forming of the end portion as viewed in a cross-sectional shape.

The respective steps are divided corresponding to respective photographic processing, and any cross-sectional view of the each step shows a stage in which forming after photographic processing is finished and a photo resist is removed. Here, the photographic processing in this specification implies a series of operations from applying of the photo resist to the development of the photo resist through the selective exposure using a mask.

(1) FIG. 5A

An Al film is formed on the glass substrate (SUB1) by sputtering and, after photographic processing, the AL film is selectively etched thus forming the gate electrodes (G) and the lower electrode portion (TL).

(2) FIG. 5B

A silicon nitride Si film is formed by a CVD method thus forming the gate insulation layer (GI).

(3) FIG. 5C

An i-type amorphous Si film and an N(+) type amorphous Si film are continuously formed via plasma CVD method and, after the photographic processing, the N(+) type amorphous Si film and the i-type amorphous Si film are selectively etched thus forming an semiconductor layer (a-Si).

(4) FIG. 5D

A Cr film is formed by sputtering and, after the photographic processing, the Cr film is selectively etched thus forming a drain electrode (SD2) and a source electrode (SD1)

(5) FIG. 5E

An insulation film is formed by a CVD method and, after the photographic processing, the insulation film is selectively etched thus forming an interlayer insulation film (PAS3). In this step, a first contact hole (CH1) is formed in the interlayer insulation film (PAS3) and the opening (CHT) is also formed in the terminal portion. Due to steps D, E in FIG. 5, the insulation film (PAST) in the terminal portion is formed.

(6) FIG. 5F

An insulation film is formed by a CVD method and, after the photographic processing, the insulation film is selectively etched thus forming an interlayer insulation film (PAS1). In this step, a second contact hole (CH2) is formed in the interlayer insulation film (PAS1).

(7) FIG. 5G

After forming an ITO film by sputtering, an Al film is formed by sputtering and, after the photographic processing, the Al film is selectively etched thus forming a reflective electrode (RAL). After the photographic processing, the ITO film is selectively etched, and the counter electrode (CT) and a first transparent conductive layer (TH1) on the lower electrode portion (TL) of the terminal portion are formed.

(8) FIG. 5H

An insulation film is formed by a CVD method and, after the photographic processing, the insulation film is selectively etched thus forming an interlayer insulation film (PAS2). In this step, a contact hole (CH3) which is contiguously formed with the second contact hole (CH2) is formed in the interlayer insulation film (PAS2).

(9) FIG. 5I

After forming an ITO film by sputtering, the photographic processing is performed and, thereafter, the ITO film is selectively etched thus forming the pixel electrode (PIX) and the second transparent conductive layer (TH2) on the first transparent conductive layer (TH1) of the terminal portion.

In this step, the ITO film is formed into the inside of the contact holes (CH1 to CH3) thus electrically connecting the pixel electrode (PIX) and the source electrode (SD1).

Figure 6:
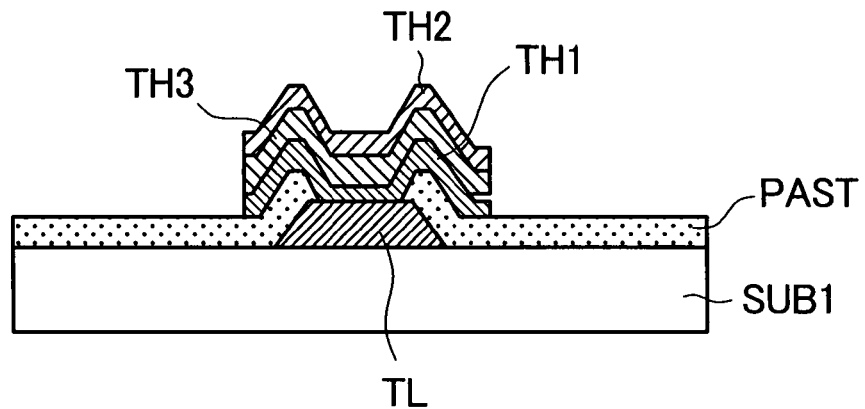
FIG. 6 is a cross-sectional view for explaining the constitution of a modification of the terminal portion of the transflective liquid crystal display device of the embodiment of the present invention.

FIG. 6 is a cross-sectional view for explaining the constitution of a modification of the terminal portion of the transflective liquid crystal display device of this embodiment.

The terminal portion shown in FIG. 6 differs from the terminal portion shown in FIG. 4 with respect to a point that an upper electrode portion (TH) is constituted of a first transparent conductive film (TH1), a metal film (TH3) which is formed on the first transparent conductive film (TH1), and a second transparent conductive film (TH2) which is formed on the metal film (TH3). Here, the metal film (TH3) is formed of, for example, an Al film or an Al alloy film such as AlNd, and the metal film (TH3) is formed in the same step as a reflective electrode (RAL).

In this embodiment, the metal film (TH3) is formed between the first transparent conductive film (TH1) and the second transparent conductive film (TH2).

Accordingly, a path which is formed in the first transparent conductive film (TH1) and through which an etchant impregnates can be interrupted by the second transparent conductive film (TH2) and the metal film (TH3) and hence, with an addition of treatment using an alkaline cleaning liquid in a subsequent manufacturing step, the corrosion of the terminal portion can be more surely prevented thus further enhancing the reliability of a liquid crystal display device.

Figure 7:
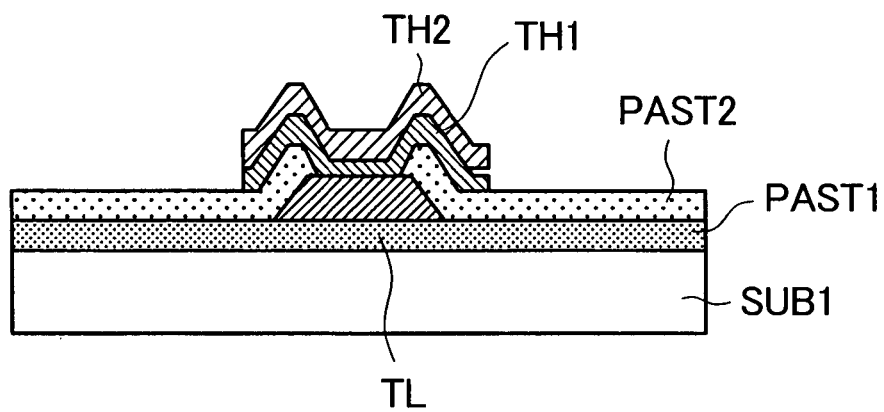
FIG. 7 is a cross-sectional view for explaining the constitution of a modification of the terminal portion of the transflective liquid crystal display device of the embodiment of the present invention.
Figure 8:
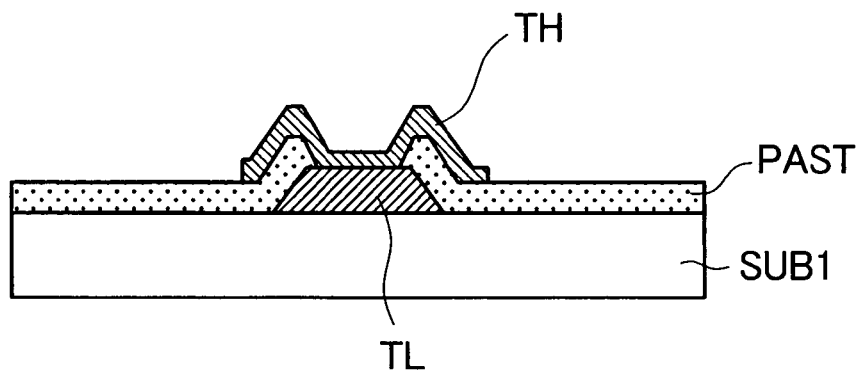
FIG. 8 is a cross-sectional view for explaining the constitution of a terminal portion of a conventional transflective liquid crystal display device.

FIG. 7 is a cross-sectional view for explaining the constitution of a modification of the terminal portion of the transflective liquid crystal display device of this embodiment.

The terminal portion shown in FIG. 7 differs from the terminal portion structure shown in FIG. 4 with respect to a point that a lower electrode portion (TL) is formed on a first insulation film (PAST1).

Accordingly, in the terminal portion shown in FIG. 7, a lower electrode portion (TL) is covered with a second insulation film (PAST2) having an opening portion through which a portion of the lower electrode portion (TL) is exposed, and an upper electrode portion (TH) is electrically connected with the lower electrode portion (TL) at an opening portion which is formed in an insulation film (PAST).

Here, in connecting the lower electrode portion (TL) of the terminal portion shown in FIG. 7 and the scanning line (GL) formed below the insulation film (PAST), the lower electrode portion (TL) and the scanning line (GL) are connected with each other in a region except for a display region (or an effective pixel region).

Here, in the above-mentioned explanation, the embodiments in which the present invention is applied to the transflective liquid crystal display device have been explained. However, the present invention is not limited to such a transflective liquid crystal display device and is also applicable to a full transmissive liquid crystal display device. Further, the present invention is not limited to an IPS-method liquid crystal display device and is applicable to an ECB (vertical electric field mode, positive liquid crystal) method liquid crystal display device or a VA (vertical electric field mode, negative liquid crystal) transflective or full transmissive liquid crystal display device.

Although the invention made by inventors of the present invention has been explained specifically in conjunction with the above-mentioned embodiments, it is needless to say that the present invention is not limited to the above-mentioned embodiments and various modifications are conceivable within a gist of the present invention.

What is claimed is:

1. A liquid crystal display device comprising a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, the upper electrode portion is constituted of a first transparent conductive film and a second transparent conductive film which is formed on the first transparent conductive film, the pixel electrodes and the counter electrodes are formed on one substrate out of the pair of substrates, the first transparent conductive film and the counter electrodes are formed at a same layer, and the second transparent conductive film and the pixel electrodes are formed at a same layer.

2. A liquid crystal display device according to claim 1, wherein the transparent conductive film of the upper electrode is formed of an amorphous ITO film.

3. A liquid crystal display device according to claim 1, wherein the liquid crystal display device includes an insulation film which covers the upper electrode portion and has an opening portion through which a portion of the upper electrode portion is exposed, and the lower electrode portion is electrically connected with the upper electrode portion which is formed on the insulation film through the opening portion formed in the insulation film.

4. A liquid crystal display device according to claim 1, wherein the lower electrode portion is constituted of a second metal film.

5. A liquid crystal display device according to claim 4, wherein the second metal film is an Al film or an Al alloy film.

6. A liquid crystal display device according to claim 1, wherein the liquid crystal display device includes an interlayer insulation film formed on the counter electrodes, and the pixel electrodes are formed on the interlayer insulation film.

7. A liquid crystal display device according to claim 1, wherein the liquid crystal display device is a transflective liquid crystal display device in which each sub pixel has a transmissive portion and a reflective portion.

8. A liquid crystal display device comprising a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, the upper electrode portion is constituted of a first transparent conductive film, a first metal film which is formed on the first transparent conductive film, and a second transparent conductive film which is formed on the first metal film, the pixel electrodes and the counter electrodes are formed on one substrate out of the pair of substrates, the first transparent conductive film and the counter electrodes are formed at a same layer, and the second transparent conductive film and the pixel electrodes are formed at a same layer.

9. A liquid crystal display device according to claim 8, wherein the first metal film is an Al film or an Al alloy film.

10. A liquid crystal display device according to claim 8, wherein the liquid crystal display device includes an interlayer insulation film formed on the counter electrodes, and the pixel electrodes are formed on the interlayer insulation film.

11. A liquid crystal display device according to claim 8, wherein the liquid crystal display device is a transflective liquid crystal display device in which each sub pixel has a transmissive portion and a reflective portion.

12. A liquid crystal display device according to claim 8, wherein the liquid crystal display device is a transflective liquid crystal display device in which each sub pixel has a transmissive portion and a reflective portion.

13. A liquid crystal display device comprising a liquid crystal display panel which includes a pair of substrates and liquid crystal sandwiched between the pair of substrates, the liquid crystal display panel including a plurality of sub pixels, each sub pixel of the plurality of sub pixels including a pixel electrode and a counter electrode, and the pixel electrode and the counter electrode generating an electric field for driving the liquid crystal, wherein a terminal portion is formed in a region outside a display region on one substrate out of the pair of substrates, the terminal portion includes a lower electrode portion and an upper electrode portion which is formed on the lower electrode portion and is electrically connected with the lower electrode portion, the upper electrode portion is constituted of a transparent conductive film, and assuming a thickness of the transparent conductive film of the upper electrode portion as do and a thickness of the electrode having a larger thickness out of the pixel electrode and the counter electrode as dc, a relationship of $1.2 < do/dc < 2$ is satisfied.

14. A liquid crystal display device according to claim 13, wherein the transparent conductive film of the upper electrode is formed of an amorphous ITO film.

15. A liquid crystal display device according to claim 13, wherein the lower electrode portion is constituted of a second metal film.

16. A liquid crystal display device according to claim 15, wherein the second metal film is an Al film or an Al alloy film.

17. A liquid crystal display device according to claim 12, wherein the pixel electrodes and the counter electrodes are formed on one substrate out of the pair of substrates, and the first transparent conductive film and the counter electrodes are formed at a same layer, and the second transparent conductive film and the pixel electrodes are formed at a same layer.

* * * * *